United States Patent
Kim et al.

(10) Patent No.: US 11,245,371 B2
(45) Date of Patent: Feb. 8, 2022

(54) AMPLIFIER FOR CUTTING LEAKAGE CURRENT AND ELECTRONIC DEVICE INCLUDING THE AMPLIFIER

(71) Applicant: Samsung Electronics Co., Ltd., Suwon-si (KR)

(72) Inventors: Kihyun Kim, Suwon-si (KR); Hyunchul Park, Suwon-si (KR); Kyuhwan An, Suwon-si (KR); Jaesik Jang, Suwon-si (KR); Yunsung Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 31 days.

(21) Appl. No.: 16/727,105

(22) Filed: Dec. 26, 2019

(65) Prior Publication Data

US 2020/0212859 A1 Jul. 2, 2020

(30) Foreign Application Priority Data

Dec. 26, 2018 (KR) .................. 10-2018-0169185

(51) Int. Cl.
*H03F 3/72* (2006.01)
*H03F 1/22* (2006.01)
*H03F 1/02* (2006.01)
*H03F 3/19* (2006.01)

(52) U.S. Cl.
CPC ............ *H03F 3/72* (2013.01); *H03F 1/0222* (2013.01); *H03F 3/19* (2013.01)

(58) Field of Classification Search
CPC ............... H03F 1/22; H03F 1/223; H03F 3/72

USPC .................................................. 330/51, 311
See application file for complete search history.

(56) References Cited

U.S. PATENT DOCUMENTS

| 8,514,015 B2* | 8/2013 | Chen ................ H03F 3/211 330/51 |
|---|---|---|
| 2005/0110527 A1 | 5/2005 | Tam et al. |
| 2006/0119435 A1 | 6/2006 | Oh et al. |
| 2007/0216481 A1 | 9/2007 | Jimenez et al. |
| 2008/0136492 A1 | 6/2008 | Hu |
| 2008/0197914 A1 | 8/2008 | Shimizu et al. |
| 2009/0174480 A1 | 7/2009 | Lee et al. |

(Continued)

FOREIGN PATENT DOCUMENTS

EP     1 833 162 A1    9/2007

OTHER PUBLICATIONS

International Search Report dated Apr. 7, 2020 in connection with International Patent Application No. PCT/KR2019/018343, 3 pages.

(Continued)

*Primary Examiner* — Steven J Mottola (57) ABSTRACT

An electronic device including an amplifier which includes a first transistor configured to receive an input signal through a gate terminal thereof and having a source terminal electrically connected to ground, a second transistor configured to transmit an output signal through a drain terminal thereof and having a gate terminal electrically connected to the ground, and a switch electrically connected to the gate terminal of the second transistor and configured to switch a voltage being supplied to the gate terminal of the second transistor in accordance with turn-on or turn-off of the amplifier.

20 Claims, 5 Drawing Sheets (56) References Cited

U.S. PATENT DOCUMENTS

| | | |
|---|---|---|
| 2009/0174481 A1* | 7/2009 | Chang .................. H03F 1/3252 |
| | | 330/277 |
| 2010/0141337 A1 | 6/2010 | Chen |
| 2010/0188150 A1 | 7/2010 | Zhu |
| 2012/0268205 A1 | 10/2012 | Presti |
| 2013/0082782 A1 | 4/2013 | Leuschner et al. |
| 2013/0315348 A1 | 11/2013 | Tasic et al. |
| 2014/0266460 A1 | 9/2014 | Nobbe et al. |
| 2015/0303876 A1 | 10/2015 | Chan et al. |
| 2017/0023957 A1 | 1/2017 | Bossu et al. |
| 2017/0279412 A1 | 9/2017 | Afsahi et al. |
| 2018/0217624 A1 | 8/2018 | Shiine et al. |

OTHER PUBLICATIONS

Written Opinion of the International Searching Authority dated Apr. 7, 2020 in connection with International Patent Application No. PCT/KR2019/018343, 5 pages.

Supplementary European Search Report dated Jul. 27, 2021 in connection with European Patent Application No. EP 19 90 3804, 9 pages.

* cited by examiner

AMPLIFIER FOR CUTTING LEAKAGE CURRENT AND ELECTRONIC DEVICE INCLUDING THE AMPLIFIER

CROSS-REFERENCE TO RELATED APPLICATION

This application is based on and claims priority under 35 U.S.C. § 119 to Korean Patent Application No. 10-2018-0169185 filed on Dec. 26, 2018 in the Korean Intellectual Property Office, the disclosure of which is herein incorporated by reference in its entirety.

BACKGROUND

1. Field

The disclosure proposes an amplifier structure for cutting leakage current that may occur in the amplifier.

2. Description of Related Art

To meet the demand for wireless data traffic having increased since deployment of 4G communication systems, efforts have been made to develop an improved 5th generation (5G) or pre-5G communication system. Therefore, the 5G or pre-5G communication system is also called a 'Beyond 4th generation (4G) Network' or a 'Post LTE System'. The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems. In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like. In the 5G system, Hybrid frequency shift keying (FSK) and quadrature amplitude modulation (QAM) Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of Things (IoT) where distributed entities, such as things, exchange and process information without human intervention. The Internet of Everything (IoE), which is a combination of the IoT technology and the Big Data processing technology through connection with a cloud server, has emerged. As technology elements, such as "sensing technology", "wired/wireless communication and network infrastructure", "service interface technology", and "Security technology" have been demanded for IoT implementation, a sensor network, a Machine-to-Machine (M2M) communication, Machine Type Communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing Information Technology (IT) and various industrial applications.

In line with this, various attempts have been made to apply 5G communication systems to IoT networks. For example, technologies such as a sensor network, MTC, and M2M communication may be implemented by beamforming, MIMO, and array antennas. Application of a cloud RAN as the above-described Big Data processing technology may also be considered to be as an example of convergence between the 5G technology and the IoT technology.

SUMMARY

An electronic device or a base station, to which a next-generation mobile communication system is applied, may include a plurality of amplifiers, and leakage current may occur in each of the amplifiers included in the electronic device or the base station.

Accordingly, the disclosure proposes an amplifier structure capable of reducing power consumption of the electronic device or the base station through cutoff of the leakage current.

According to an embodiment of the disclosure, an electronic device including an amplifier, wherein the amplifier comprises a first transistor configured to receive an input signal through a gate terminal thereof and having a source terminal electrically connected to ground; a second transistor configured to transmit an output signal through a drain terminal thereof and having a gate terminal electrically connected to the ground; and a switch electrically connected to the gate terminal of the second transistor and configured to switch a voltage being supplied to the gate terminal of the second transistor in accordance with turn-on or turn-off of the amplifier.

According to an embodiment of the disclosure, a base station including an amplifier, wherein the amplifier comprises a first transistor configured to receive an input signal through a gate terminal thereof and having a source terminal electrically connected to ground; a second transistor configured to transmit an output signal through a drain terminal thereof and having a gate terminal electrically connected to the ground; and a switch electrically connected to the gate terminal of the second transistor and configured to switch a voltage being supplied to the gate terminal of the second transistor in accordance with turn-on or turn-off of the amplifier.

According to the embodiment of the disclosure, the leakage current occurring in the amplifier can be cut off, and thus the power consumption of the amplifier caused by the leakage current can be reduced. In addition, even in a stack amplifier forming one amplifier through stacking of a plurality of amplifiers, the leakage current occurring in the stack amplifier can be cut off through the amplifier structure disclosed in the disclosure.

Effects that can be obtained in the disclosure are not limited to the above-described effects, and other unmentioned effects can be clearly understood by those of ordinary skill in the art to which the disclosure pertains from the following description.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

In explaining embodiments of the disclosure, explanation of technical contents that are well known in the art to which the disclosure pertains and are not directly related to the disclosure will be omitted. This is to transfer the subject matter of the disclosure more clearly without obscuring the same through omission of unnecessary explanations.

For the same reason, in the accompanying drawings, sizes and relative sizes of some constituent elements may be exaggerated, omitted, or briefly illustrated. Further, sizes of the respective constituent elements do not completely reflect the actual sizes thereof. In the drawings, the same drawing reference numerals are used for the same or corresponding elements across various figures.

The aspects and features of the disclosure and methods for achieving the aspects and features will be apparent by referring to the embodiments to be described in detail with reference to the accompanying drawings. However, the disclosure is not limited to the embodiments disclosed hereinafter, and it can be implemented in diverse forms. The matters defined in the description, such as the detailed construction and elements, are only specific details provided to assist those of ordinary skill in the art in a comprehensive understanding of the disclosure, and the disclosure is only defined within the scope of the appended claims. In the entire description of the disclosure, the same drawing reference numerals are used for the same elements across various figures.

In this case, it will be understood that each block of the flowchart illustrations, and combinations of blocks in the flowchart illustrations, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

Also, each block of the flowchart illustrations may represent a module, segment, or portion of code, which includes one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

In this case, the term "~unit", as used in an embodiment, means, but is not limited to, a software or hardware component, such as FPGA or ASIC, which performs certain tasks. However, "~unit" is not meant to be limited to software or hardware. The term "~unit" may advantageously be configured to reside on the addressable storage medium and configured to execute on one or more processors. Thus, "~unit" may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and "~units" may be combined into fewer components and "~units" or further separated into additional components and "~units". Further, the components and "~units" may be implemented to operate one or more CPUs in a device or a security multimedia card. Further, in an embodiment, "~unit" may include one or more processors.

Figure 1:
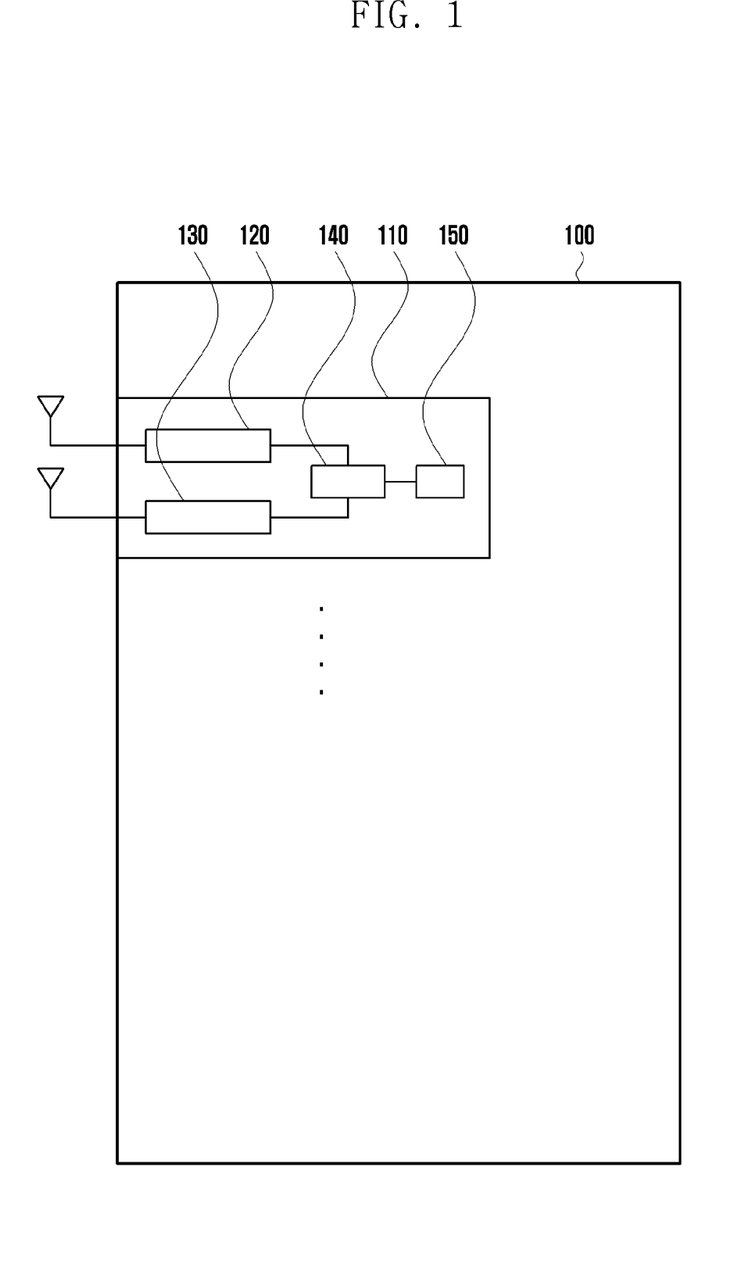
FIG. 1 illustrates a diagram of the internal structure of an electronic device to which a next-generation mobile communication system is applied.

FIG. 1 illustrates a diagram of the internal structure of an electronic device to which a next-generation mobile communication system is applied.

According to an embodiment, an electronic device 100 may include at least one wireless communication chip 110. According to various embodiments, the electronic device may form a plurality of chains using the wireless communication chip 110. According to an embodiment, the chain may include a radio frequency (RF) chain.

According to an embodiment, the wireless communication chip 110 may form a beam through the multiple chains and it may perform beam sweeping. For example, the wireless communication chip 110 may have 16 RF chains, and it may control the respective RF chains to form the beam having a specific directivity.

According to an embodiment, the wireless communication chip 110 may include a phase shifter 150 shifting a phase of an RF signal being supplied from a wireless communication control circuit provided in the electronic device, a switch 140 selectively connecting a transmitting end and a receiving end to each other, a first amplifier 120 connected to the transmitting end to amplify the RF signal being supplied from the wireless communication control circuit, and a second amplifier 130 amplifying a power of an RF signal being supplied from an outside of the electronic device 100.

According to an embodiment, the first amplifier 120 may be a power amplifier (PA), and the second amplifier 130 may be a low noise amplifier (LNA). According to various embodiments, the second amplifier 130 has a low noise figure (NF), and thus a low noise may occur in the amplifier.

According to an embodiment, in the next-generation mobile communication system using mmWave bands, the number of RF chains that are required to perform beamforming operation may be increased. For example, in an LTE communication system, communication becomes possible using only 64 RF chains, while in the next-generation mobile communication system, more than 512 RF chains may be required to perform a smooth communication.

According to an embodiment, a plurality of wireless communication chips may be deployed inside the electronic device to form a large number of RF chains. For example, 512 RF chains may be formed through the electronic device by deploying 8 wireless communication chips each of which has 64 RF chains inside the electronic device. According to various embodiments, the 8 wireless communication chips deployed inside the electronic device may be deployed at ends of the electronic device to radiate radio waves out of the electronic device.

According to an embodiment, amplifiers may be deployed inside the electronic device to correspond to the number of RF chains created inside the electronic device. For example, if 512 RF chains are formed inside the electronic device, 512 amplifiers (e.g., PA amplifiers or LNA amplifiers as described above) may be included in the electronic device.

According to an embodiment, even if the amplifier is turned off, leakage current may occur, and in this case, power consumption of the amplifier may be increased due to the leakage current. According to various embodiments, in the next-generation mobile communication system, an electronic device supporting mmWave bands may include a plurality of amplifiers, and the power consumption of the electronic device may be increased due to the leakage current.

Figure 2:
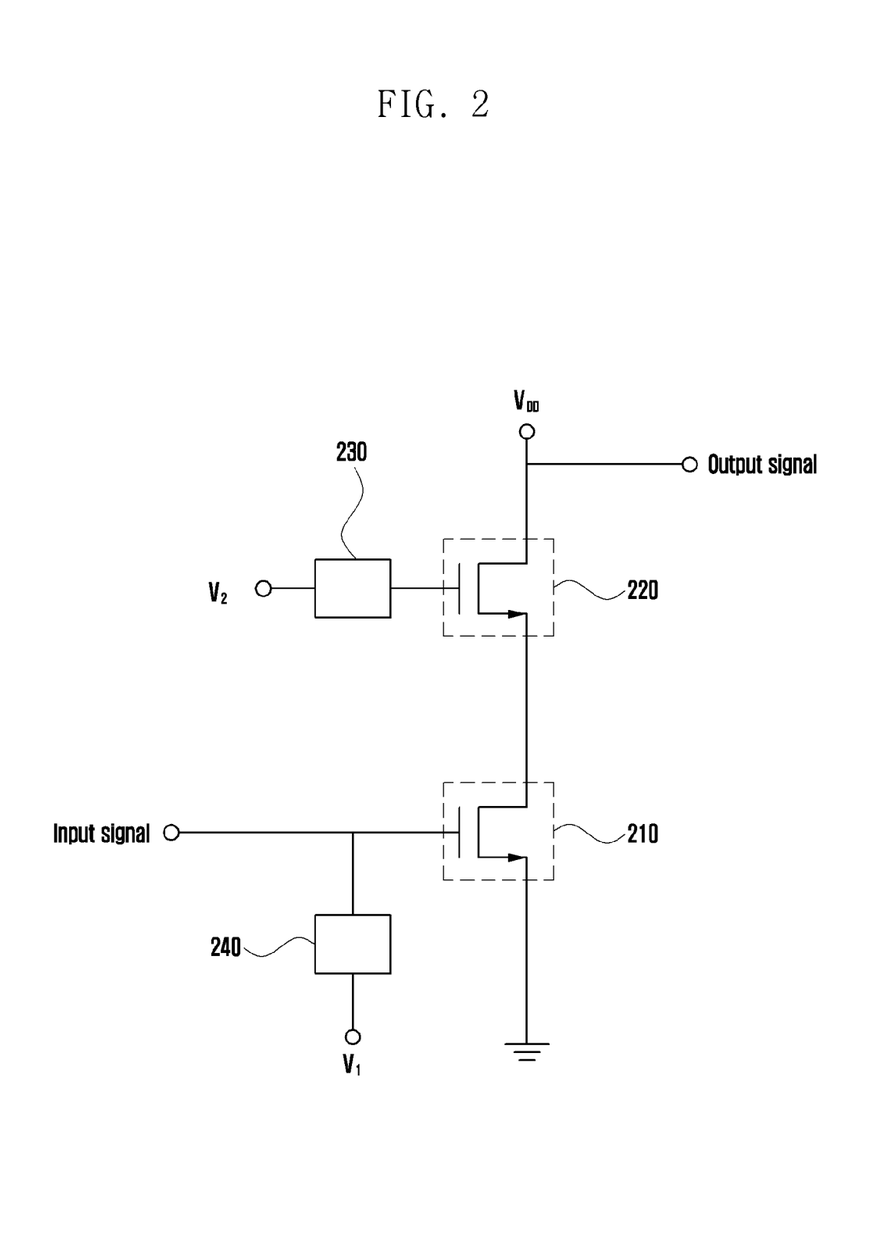
FIG. 2 illustrates a diagram of an amplifier structure according to an embodiment of the disclosure.

FIG. 2 illustrates a diagram of an amplifier structure according to an embodiment of the disclosure.

According to an embodiment, an amplifier may include a first transistor 210 receiving an input signal through a gate terminal thereof and having a source terminal electrically connected to ground, a second transistor 220 transmitting an output signal through a drain terminal thereof and having a gate terminal electrically connected to the ground, and a switch 230 electrically connected to the gate terminal of the second transistor and switching a voltage being supplied to the gate terminal of the second transistor in accordance with turn-on or turn-off of the amplifier.

According to an embodiment, the amplifier may include a cascode amplifier. According to various embodiments, the cascode amplifier may be a two-stage circuit composed of a transconductance amplifier and a buffer amplifier. According to an embodiment, the cascode amplifier can heighten a gain value, an input impedance value, and an output impedance value as compared with an amplifier having only one stage.

According to an embodiment, the cascode amplifier may have an increased bandwidth due to the decrease of the Miller effect. For example, because the gate of the second transistor 220 of FIG. 2 is grounded, the source terminal voltage of the second transistor 220 and the drain terminal voltage of the first transistor 210 may be constantly maintained. In other words, the second transistor 220 may provide a low input resistance to the first transistor 210. According to various embodiments, the gain value of the first transistor 210 may be decreased due to the low input resistance, and thus the Miller effect may be decreased to increase the bandwidth of the amplifier. According to an embodiment, the decrease of the gain value of the first transistor 210 can be compensated for through the improvement of the gain value of the second transistor 220.

According to an embodiment, one transistor constituting the cascode amplifier may be a common source transistor, and the other transistor may be a common gate transistor. For example, the first transistor 210 of FIG. 2 may operate as the common source transistor, and the second transistor 220 may operate as the common gate transistor.

According to an embodiment, a first operating voltage $v_1$ for operating the first transistor 210 may be supplied to the gate terminal of the first transistor 210 through a first impedance value 240. For example, if the first operating voltage $v_1$ of "0" is provided, the first transistor 210 may not operate, whereas if the first operating voltage $v_1$ of $V_{DD}$ is provided, the first transistor 210 may operate. According to various embodiments, the first impedance value 240 may be resistance having a specific value, and the $V_{DD}$ value may be a specific voltage value that exceeds a threshold voltage value of the first transistor.

According to an embodiment, if the amplifier is turned on, the switch 230 may supply a second operating voltage v2 to the gate terminal of the second transistor 220, whereas if the amplifier is turned off, the switch 230 may electrically connect the gate terminal of the second transistor 220 to ground. According to various embodiments, if the amplifier is turned off, the gate terminal of the second transistor 220 is electrically connected to the ground, and thus the leakage current occurring by the amplifier may flow out to the ground through the switch without passing through the first transistor 210.

According to an embodiment, if the amplifier is turned off, the leakage current occurring in the amplifier is cut off through the switch 230, and thus the power consumption of the amplifier can be decreased. According to various embodiments, if the amplifier is turned on, the second operating voltage $v_2$ may be provided to the second transistor through the switch 230, and thus the second transistor can operate. According to an embodiment, the second operating voltage $v_2$ may be a specific voltage value that exceeds the threshold voltage value of the first transistor.

The amplifier structure disclosed in FIG. 2 is merely a structure according to an embodiment for convenience in explanation, and thus the scope of the disclosure should not be limited to the amplifier structure as illustrated in FIG. 2. According to various embodiments, even in a stacked amplifier structure including a plurality of transistors, the amplifier structure disclosed in the disclosure can be applied.

Figure 3:
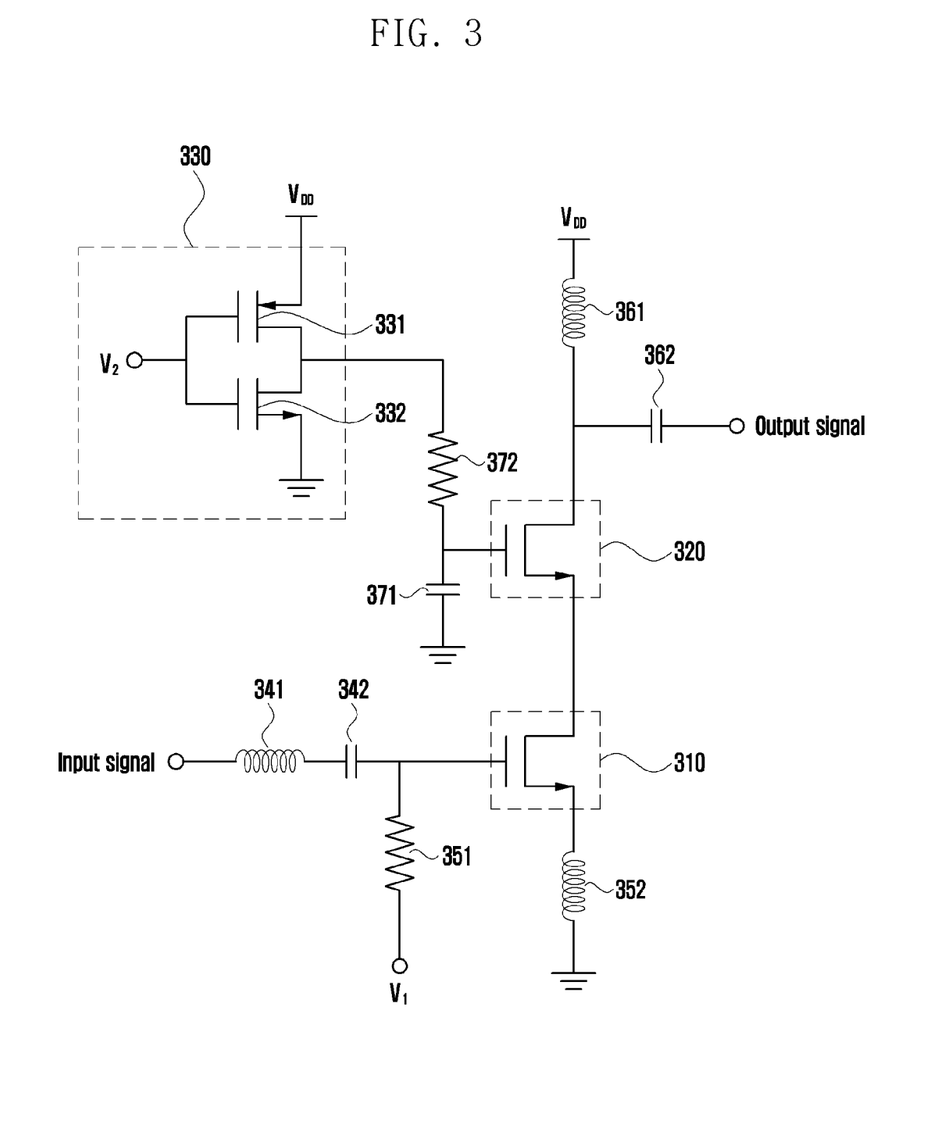
FIG. 3 illustrates a diagram of an amplifier structure in the case where a switch is configured by CMOS according to an embodiment of the disclosure.

FIG. 3 illustrates a diagram of an amplifier structure in the case where a switch is configured by CMOS according to an embodiment of the disclosure.

According to an embodiment, an amplifier may include a first transistor 310 receiving an input signal through a gate terminal thereof and having a source terminal electrically connected to ground, a second transistor 320 transmitting an output signal through a drain terminal thereof and having a gate terminal electrically connected to the ground, and a switch 330 electrically connected to the gate terminal of the second transistor and switching a voltage being supplied to the gate terminal of the second transistor in accordance with turn-on or turn-off of the amplifier. According to various embodiments, the amplifier may be a cascade type amplifier.

According to an embodiment, an input signal may be supplied to the gate terminal of the first transistor 310 through a first inductor 341 and a first capacitor 342. According to various embodiments, the first inductor 341 and the first capacitor 342 may be input matching elements of the amplifier. A first operating voltage $v_1$ for operating the first transistor 310 may be supplied to the gate terminal of the first transistor 310 through a first resistor 351. For example, if the first operating voltage $v_1$ of "0" is provided, the first transistor 310 may be turned off, whereas if the first operating voltage $v_1$ becomes $V_{DD}$ that exceeds a threshold voltage value of the first transistor 310, the first transistor 310 may be turned on.

According to an embodiment, a second inductor 352 may be electrically connected between the source terminal of the first transistor 352 and ground. According to various embodiments, the second inductor 352 may remove an intermodulation component occurring in accordance with an operation of the amplifier. For example, the second inductor 352 may improve linearity of the amplifier by removing a third-order transconductance component of the amplifier.

According to an embodiment, an output signal may be transmitted through the drain terminal of the second transistor 320. According to various embodiments, a third inductor 361 and a second capacitor 362 may be electrically connected to the drain terminal of the second transistor. For example, the third inductor 361 and the second capacitor 362 may be output mapping elements of the amplifier.

According to an embodiment, the switch 330 may include a complementary metal oxide semiconductor (CMOS). According to various embodiments, if the amplifier is turned on, a negative channel metal oxide semiconductor (NMOS) 331 constituting the CMOS may be turned on, whereas if the amplifier is turned off, a positive channel metal oxide semiconductor (PMOS) 332 constituting the CMOS may be turned on.

According to an embodiment, if the amplifier is turned on, a second operating voltage $v_2$ may have a value of "0", and thus the NMOS 331 may be turned on, and the PMOS 332 may be turned off. According to various embodiments, if only the NMOS 331 is turned on, the voltage $V_{DD}$ may be supplied to the gate terminal of the second transistor 320 through a second resistor 372. According to an embodiment, the second transistor 320 may be turned on by the voltage being supplied through the second resistor 372, and a third capacitor 371 may be charged with the voltage.

According to an embodiment, if the amplifier is turned off, the second operating voltage $v_2$ may have the value of $V_{DD}$, and thus the NMOS 331 may be turned off, and the PMOS 332 may be turned on. According to various embodiments, if only the PMOS 332 is turned on, the gate terminal of the second transistor 320 may be electrically connected to the ground. According to an embodiment, as the gate terminal of the second transistor 320 is electrically connected to the ground, leakage current occurring due to the turn-off of the amplifier may flow to the ground through the PMOS 332 of the switch 330.

In the related art, if the amplifier is turned off, the leakage current of the amplifier flows to the ground via the second transistor 320 and the first transistor 310. That is, according to the related art, even if the amplifier is turned off, power consumption occurs due to the leakage current. However, according to an embodiment disclosed in the disclosure, the leakage current of the amplifier is made to flow through the switch 330, and thus the power consumption of the amplifier can be reduced.

Figure 4:
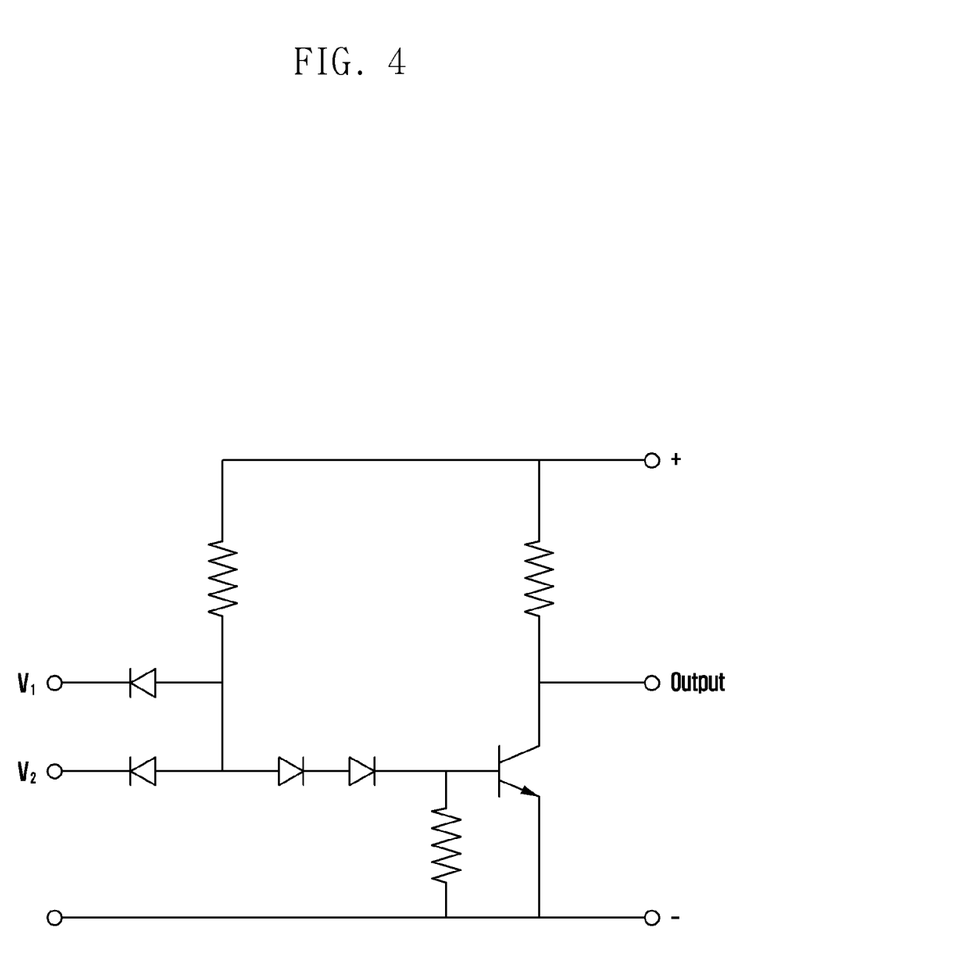
FIG. 4 illustrates a diagram of a switch configured by a diode-transistor logic according to an embodiment of the disclosure.

FIG. 4 illustrates a diagram of a switch configured by a diode-transistor logic according to an embodiment of the disclosure.

According to an embodiment, the switch constituting the amplifier may include a diode-transistor logic as illustrated in FIG. 4. According to various embodiments, the diode-transistor logic may have low power consumption and high switching speed. Accordingly, in the amplifier structure of the electronic device to which the next-generation mobile communication system is applied, the diode-transistor logic as illustrated in FIG. 4 may be applied as the switch.

More specifically, by changing an output value of the diode-transistor logic through the control of $v_1$ and $v_2$ of the diode-transistor logic, it becomes possible to cut off the leakage current occurring in the amplifier when the amplifier including the diode-transistor logic is turned off.

According to an embodiment, the switch constituting the amplifier may include the diode-transistor logic, and if the amplifier is turned on, the diode-transistor logic may supply the operating voltage of the transistor to the gate terminal of the transistor constituting the amplifier, whereas if the amplifier is turned off, the diode-transistor logic may electrically connect the gate terminal of the transistor to the ground. According to various embodiments, if the amplifier is turned off, the gate terminal of the transistor is electrically connected to the ground, and thus the leakage current of the amplifier, which occurs when the amplifier is turned off, can be reduced.

According to an embodiment, the switch constituting the amplifier may include a digital inverter, and if the amplifier is turned on, the digital inverter may supply the operating voltage of the transistor to the gate terminal of the transistor constituting the amplifier, whereas if the amplifier is turned off, the digital inverter may electrically connect the gate terminal of the transistor to the ground.

According to an embodiment, the switch constituting the amplifier may include a multiplexer, and if the amplifier is turned on, the multiplexer may supply the operating voltage of the transistor to the gate terminal of the transistor constituting the amplifier, whereas if the amplifier is turned off, the multiplexer may electrically connect the gate terminal of the transistor to the ground.

Figure 5:
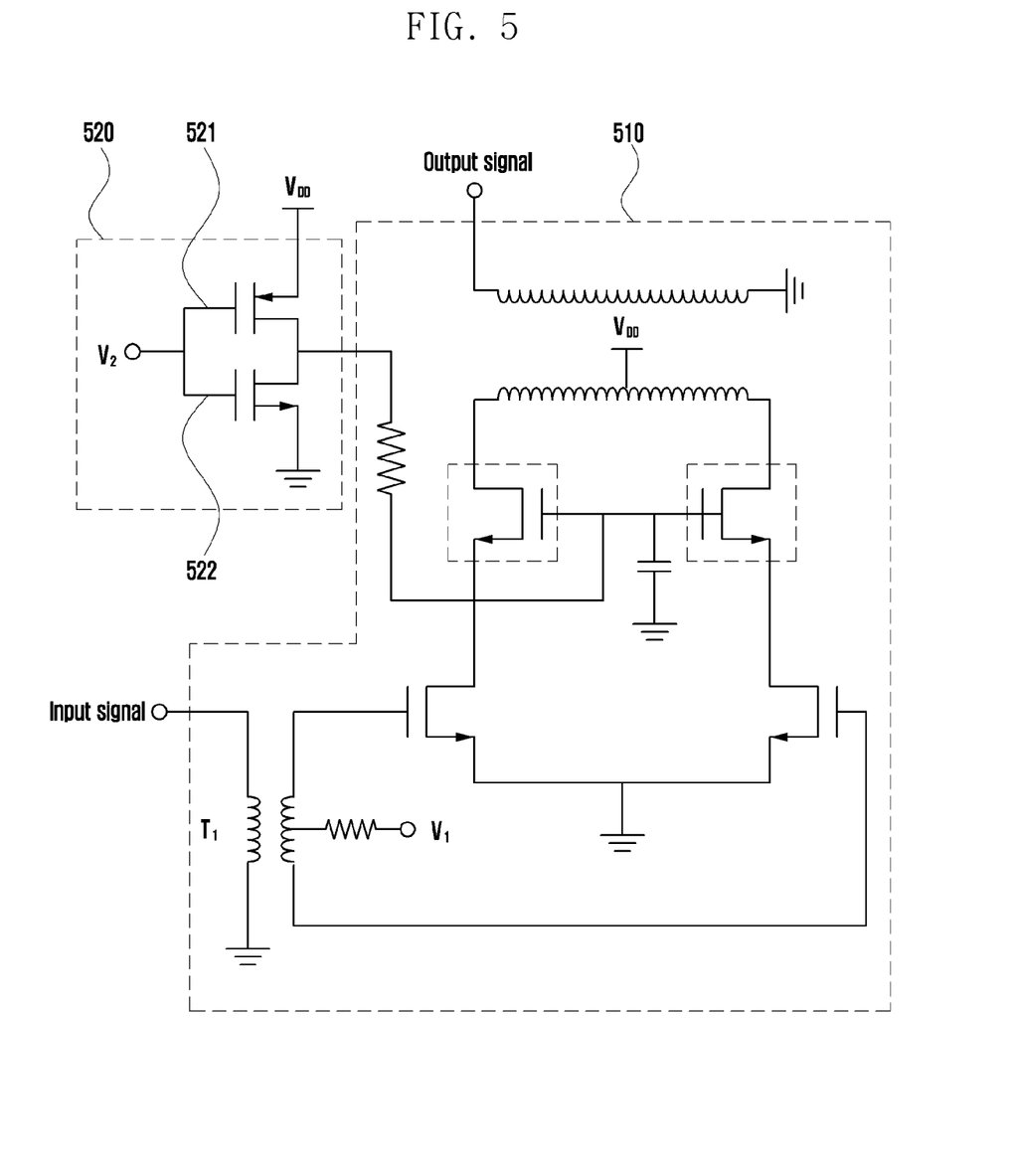
FIG. 5 illustrates a diagram of a differential amplifier structure according to an embodiment of the disclosure.

FIG. 5 illustrates a diagram of a differential amplifier structure according to an embodiment of the disclosure.

According to an embodiment, an amplifier may include a single ended type cascode amplifier or a differential type cascode amplifier. For example, the amplifier structure as illustrated in FIG. 3 may be the single ended type cascode amplifier.

According to an embodiment, the differential type cascode amplifier may include an amplification unit 510 amplifying and outputting an input signal, and a switch 520 electrically connected to gate terminals of transistors included in the amplification unit 510 to cut off leakage current occurring due to the amplification unit. The amplification unit 510 performing differential amplification operation may amplify an electric potential difference between two input signals $v_1$ and $v_2$ to output one output signal.

According to an embodiment, the switch 520 may include a complementary metal oxide semiconductor (CMOS). According to various embodiments, if the amplification unit 510 is turned on, an NMOS 521 constituting the CMOS may be turned on, whereas if the amplification unit 510 is turned off, a PMOS 522 constituting the CMOS may be turned on.

According to an embodiment, if the amplification unit 510 is turned on, the second operating voltage $v_2$ may have a value of "0", and thus the NMOS 521 may be turned on, and the PMOS 522 may be turned off. According to various embodiments, if only the NMOS 521 is turned on, a voltage $V_{DD}$ may be supplied to the gate terminals of the transistors of the amplification unit 510 (more specifically, they may mean the gate terminals of common-gate transistors in the amplification unit) through a resistor. According to an embodiment, if the amplification unit 510 is turned on, the first operating voltage $v_1$ may have the value of $V_{DD}$.

According to an embodiment, if the amplification unit 510 is turned off, the second operating voltage $v_2$ may have the value of $V_{DD}$, and thus the NMOS 521 may be turned off, and the PMOS 522 may be turned on. According to various embodiments, if only the PMOS 521 is turned on, the gate terminals of the transistors of the amplification unit 510 (more specifically, they may mean the gate terminals of the common-gate transistors in the amplification unit) may be electrically connected to the ground. According to an embodiment, as the gate terminals of the common-gate transistors of the amplification unit 510 are electrically connected to the ground, leakage current occurring due to the turn-off of the amplification unit may flow to the ground through the PMOS 522 of the switch 520.

According to an embodiment, an electronic device may include an amplifier, and the amplifier may include a first transistor configured to receive an input signal through a gate terminal thereof and having a source terminal electrically connected to ground, a second transistor configured to transmit an output signal through a drain terminal thereof and having a gate terminal electrically connected to the ground, and a switch electrically connected to the gate terminal of the second transistor and configured to switch a voltage being supplied to the gate terminal of the second transistor in accordance with turn-on or turn-off of the amplifier.

According to an embodiment, the switch may include a complementary metal oxide semiconductor (CMOS), and if the amplifier is turned on, an NMOS constituting the CMOS may be turned on, whereas if the amplifier is turned off, a PMOS constituting the CMOS may be turned on.

According to an embodiment, if the amplifier is turned on, an operating voltage of the second transistor may be supplied to the gate terminal of the second transistor, whereas if the amplifier is turned off, the gate terminal of the second transistor may be electrically connected to the ground.

According to an embodiment, if the gate terminal of the second transistor is electrically connected to the ground, leakage current of the amplifier may be cut off.

According to an embodiment, the switch may include a digital inverter, and if the amplifier is turned on, the digital inverter may supply an operating voltage of the second transistor to the gate terminal of the second transistor, whereas if the amplifier is turned off, the digital inverter may electrically connect the gate terminal of the second transistor to the ground.

According to an embodiment, the switch may include a multiplexer, and if the amplifier is turned on, the multiplexer may supply an operating voltage of the second transistor to the gate terminal of the second transistor, whereas if the amplifier is turned off, the multiplexer may electrically connect the gate terminal of the second transistor to the ground.

According to an embodiment, the switch may include a diode-transistor logic, and if the amplifier is turned on, the diode-transistor logic may supply an operating voltage of the second transistor to the gate terminal of the second transistor, whereas if the amplifier is turned off, the diode-transistor logic may electrically connect the gate terminal of the second transistor to the ground.

According to an embodiment, the amplifier may include a single ended type cascode amplifier or a differential type cascode amplifier.

According to an embodiment, the amplifier may further include a capacitor electrically connected between the gate terminal of the second transistor and the ground, and if the amplifier is turned on, the capacitor may be charged with an operating voltage of the second transistor.

According to an embodiment, the amplifier may further include an inductor electrically connected between the source terminal of the first transistor and the ground, and the inductor may remove an intermodulation component occurring in accordance with an operation of the amplifier.

According to an embodiment, a base station may include an amplifier, and the amplifier may include a first transistor configured to receive an input signal through a gate terminal thereof and having a source terminal electrically connected to ground, a second transistor configured to transmit an output signal through a drain terminal thereof and having a gate terminal electrically connected to the ground, and a switch electrically connected to the gate terminal of the second transistor and configured to switch a voltage being supplied to the gate terminal of the second transistor in accordance with turn-on or turn-off of the amplifier.

According to an embodiment, the switch may include a complementary metal oxide semiconductor (CMOS), and if the amplifier is turned on, an NMOS constituting the CMOS may be turned on, whereas if the amplifier is turned off, a PMOS constituting the CMOS may be turned on.

According to an embodiment, if the amplifier is turned on, an operating voltage of the second transistor may be supplied to the gate terminal of the second transistor, whereas if the amplifier is turned off, the gate terminal of the second transistor may be electrically connected to the ground.

According to an embodiment, if the gate terminal of the second transistor is electrically connected to the ground, leakage current of the amplifier may be cut off.

According to an embodiment, the switch may include a digital inverter, and if the amplifier is turned on, the digital inverter may supply an operating voltage of the second transistor to the gate terminal of the second transistor, whereas if the amplifier is turned off, the digital inverter may electrically connect the gate terminal of the second transistor to the ground.

According to an embodiment, the switch may include a multiplexer, and if the amplifier is turned on, the multiplexer may supply an operating voltage of the second transistor to the gate terminal of the second transistor, whereas if the amplifier is turned off, the multiplexer may electrically connect the gate terminal of the second transistor to the ground.

According to an embodiment, the switch may include a diode-transistor logic, and if the amplifier is turned on, the diode-transistor logic may supply an operating voltage of the second transistor to the gate terminal of the second transistor, whereas if the amplifier is turned off, the diode-transistor logic may electrically connect the gate terminal of the second transistor to the ground.

According to an embodiment, the amplifier may include a single ended type cascode amplifier or a differential type cascode amplifier.

According to an embodiment, the amplifier may further include a capacitor electrically connected between the gate terminal of the second transistor and the ground, and if the amplifier is turned on, the capacitor may be charged with an operating voltage of the second transistor.

According to an embodiment, the amplifier may further include an inductor electrically connected between the source terminal of the first transistor and the ground, and the inductor may remove an intermodulation component occurring in accordance with an operation of the amplifier.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device including an amplifier, wherein the amplifier comprises:
   a first transistor configured to receive an input signal through a gate terminal, wherein the first transistor includes a source terminal electrically connected to a ground;
   a second transistor configured to transmit an output signal through a drain terminal, wherein the second transistor includes a gate terminal electrically connected to the ground; and
   a switch electrically connected to the gate terminal of the second transistor, wherein the switch is configured to switch a voltage being supplied to the gate terminal of the second transistor in accordance with a turn-on state or a turn-off state of the amplifier, wherein the switch comprises at least one of a multiplexer or a diode-transistor logic,
   wherein if the amplifier is turned on, the switch supplies an operating voltage of the second transistor to the gate terminal of the second transistor; and
   wherein if the amplifier is turned off, the switch electrically connects the gate terminal of the second transistor to the ground.

2. The electronic device of claim 1, wherein the switch comprises:
   A complementary metal oxide semiconductor (CMOS);
   if the amplifier is turned on, a negative channel metal oxide semiconductor (NMOS) constituting the CMOS, the NMOS being turned on; and
   if the amplifier is turned off, a positive channel metal oxide semiconductor (PMOS) constituting the CMOS, the PMOS being turned on.

3. The electronic device of claim 2, wherein:
   if the amplifier is turned on, the operating voltage of the second transistor is supplied to the gate terminal of the second transistor; and
   if the amplifier is turned off, the gate terminal of the second transistor is electrically connected to the ground.

4. The electronic device of claim 3, wherein if the gate terminal of the second transistor is electrically connected to the ground, leakage current of the amplifier is cut off.

5. The electronic device of claim 1, wherein:
   the switch further comprises a digital inverter;
   if the amplifier is turned on, the digital inverter supplies the operating voltage of the second transistor to the gate terminal of the second transistor; and
   if the amplifier is turned off, the digital inverter electrically connects the gate terminal of the second transistor to the ground.

6. The electronic device of claim 1, wherein:
   if the amplifier is turned on, the multiplexer supplies the operating voltage of the second transistor to the gate terminal of the second transistor; and
   if the amplifier is turned off, the multiplexer electrically connects the gate terminal of the second transistor to the ground.

7. The electronic device of claim 1, wherein:
   if the amplifier is turned on, the diode-transistor logic supplies the operating voltage of the second transistor to the gate terminal of the second transistor; and
   if the amplifier is turned off, the diode-transistor logic electrically connects the gate terminal of the second transistor to the ground.

8. The electronic device of claim 1, wherein the amplifier further comprises a single ended type cascade amplifier or a differential type cascade amplifier.

9. The electronic device of claim 1, wherein the amplifier further comprises a capacitor electrically connected between the gate terminal of the second transistor and the ground, and if the amplifier is turned on, the capacitor is charged with the operating voltage of the second transistor.

10. The electronic device of claim 1, wherein the amplifier further comprises an inductor electrically connected between the source terminal of the first transistor and the ground, the inductor configured to remove an intermodulation component occurring in accordance with an operation of the amplifier.

11. A base station including an amplifier, wherein the amplifier comprises:
- a first transistor configured to receive an input signal through a gate terminal, wherein the first transistor includes a source terminal electrically connected to a ground;
- a second transistor configured to transmit an output signal through a drain terminal, wherein the second transistor includes a gate terminal electrically connected to the ground; and
- a switch electrically connected to the gate terminal of the second transistor, wherein the switch is configured to switch a voltage being supplied to the gate terminal of the second transistor in accordance with a turn-on state or a turn-off state of the amplifier, wherein the switch comprises at least one of a multiplexer or a diode-transistor logic,
- wherein if the amplifier is turned on, the switch supplies an operating voltage of the second transistor to the gate terminal of the second transistor; and
- wherein if the amplifier is turned off, the switch electrically connects the gate terminal of the second transistor to the ground.

12. The base station of claim 11, wherein the switch comprises:
- a complementary metal oxide semiconductor (CMOS);
- if the amplifier is turned on, a negative channel metal oxide semiconductor (NMOS) constituting the CMOS, the NMOS being turned on; and
- if the amplifier is turned off, a positive channel metal oxide semiconductor (PMOS) constituting the CMOS, the PMOS being turned on.

13. The base station of claim 12, wherein:
- if the amplifier is turned on, the operating voltage of the second transistor is supplied to the gate terminal of the second transistor; and
- if the amplifier is turned off, the gate terminal of the second transistor is electrically connected to the ground.

14. The base station of claim 13, wherein if the gate terminal of the second transistor is electrically connected to the ground, leakage current of the amplifier is cut off.

15. The base station of claim 11, wherein:
- the switch further comprises a digital inverter;
- if the amplifier is turned on, the digital inverter supplies the operating voltage of the second transistor to the gate terminal of the second transistor; and
- if the amplifier is turned off, the digital inverter electrically connects the gate terminal of the second transistor to the ground.

16. The base station of claim 11, wherein:
- if the amplifier is turned on, the multiplexer supplies the operating voltage of the second transistor to the gate terminal of the second transistor; and
- if the amplifier is turned off, the multiplexer electrically connects the gate terminal of the second transistor to the ground.

17. The base station of claim 11, wherein:
- if the amplifier is turned on, the diode-transistor logic supplies the operating voltage of the second transistor to the gate terminal of the second transistor; and
- if the amplifier is turned off, the diode-transistor logic electrically connects the gate terminal of the second transistor to the ground.

18. The base station of claim 11, wherein the amplifier further comprises a single ended type cascode amplifier or a differential type cascode amplifier.

19. The base station of claim 11, wherein the amplifier further comprises a capacitor electrically connected between the gate terminal of the second transistor and the ground, and if the amplifier is turned on, the capacitor is charged with the operating voltage of the second transistor.

20. The base station of claim 11, wherein the amplifier further comprises an inductor electrically connected between the source terminal of the first transistor and the ground, the inductor configured to remove an intermodulation component occurring in accordance with an operation of the amplifier.

* * * * *

UNITED STATES PATENT AND TRADEMARK OFFICE
CERTIFICATE OF CORRECTION

| | | |
|---|---|---|
| PATENT NO. | : 11,245,371 B2 | Page 1 of 1 |
| APPLICATION NO. | : 16/727105 | |
| DATED | : February 8, 2022 | |
| INVENTOR(S) | : Kim et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 40 days.

Signed and Sealed this
Seventh Day of February, 2023

Katherine Kelly Vidal
*Director of the United States Patent and Trademark Office*